(12) United States Patent
Nakayama et al.

(10) Patent No.: US 11,959,742 B2
(45) Date of Patent: Apr. 16, 2024

(54) SENSOR

(71) Applicant: OMRON Corporation, Kyoto (JP)

(72) Inventors: Yusuke Nakayama, Kameoka (JP); Takuya Okamoto, Ayabe (JP)

(73) Assignee: OMRON Corporation, Kyoto (JP)

(*) Notice: Subject to any disclaimer, the term of this patent is extended or adjusted under 35 U.S.C. 154(b) by 438 days.

(21) Appl. No.: 17/292,724

(22) PCT Filed: Nov. 7, 2019

(86) PCT No.: PCT/JP2019/043734
§ 371 (c)(1),
(2) Date: May 11, 2021

(87) PCT Pub. No.: WO2020/100723
PCT Pub. Date: May 22, 2020

(65) Prior Publication Data
US 2022/0003530 A1    Jan. 6, 2022

(30) Foreign Application Priority Data

Nov. 12, 2018   (JP) .................................. 2018-212354

(51) Int. Cl.
G01B 7/00       (2006.01)
H03K 17/95      (2006.01)
H05K 9/00       (2006.01)

(52) U.S. Cl.
CPC ......... *G01B 7/003* (2013.01); *H03K 17/9505* (2013.01); *H03K 17/952* (2013.01); *H05K 9/0007* (2013.01)

(58) Field of Classification Search
CPC .... G01B 7/003; G01B 7/023; H03K 17/9505; H03K 17/952; H03K 2017/9455;
(Continued)

(56) References Cited

U.S. PATENT DOCUMENTS

| | | | | |
|---|---|---|---|---|
| 6,133,654 A | * | 10/2000 | Heimlicher | H03K 17/9525 324/207.16 |
| 2009/0189600 A1 | * | 7/2009 | Kurkovskiy | H03K 17/9545 324/207.16 |
| 2013/0021029 A1 | | 1/2013 | Hoenicka et al. | |

FOREIGN PATENT DOCUMENTS

| | | |
|---|---|---|
| DE | 3730113 | 3/1989 |
| EP | 1372173 | 12/2003 |

(Continued)

OTHER PUBLICATIONS

"International Search Report (Form PCT/ISA/210) of PCT/JP2019/043734," dated Jan. 7, 2020, with English translation thereof, pp. 1-2.

(Continued)

*Primary Examiner* — Daniel R Miller
(74) *Attorney, Agent, or Firm* — JCIPRNET

(57) ABSTRACT

This sensor includes: a housing 10 which houses an electronic component in the internal space; a detection unit 40 which has a coil 42 and a core 41 that houses the coil 42 and which is arranged on the end side in the internal space; a substrate 30 which is arranged more inside the internal space than the detection unit 40 and on which a circuit electrically connected to the coil 42 is provided; a first shield 451 at least one portion of which is arranged further on the end side in the internal space than the detection unit 40 and which suppresses the penetration of noise from outside of the housing 10; and a spacer 51 which is positioned between the first shield 451 and the detection unit 40 and which separates the surfaces of the first shield 451 and the detection unit 40 that face each other.

6 Claims, 3 Drawing Sheets

(58) Field of Classification Search
CPC ........... H03K 17/95; H03K 2017/9706; H05K 9/0007; H05K 9/00; G01R 33/0076; G01R 33/0283; H01H 36/00
See application file for complete search history.

(56) References Cited

FOREIGN PATENT DOCUMENTS

| | | | |
|---|---|---|---|
| JP | H08235985 A | * | 9/1996 |
| JP | H0945196 | | 2/1997 |
| JP | 2009048902 | | 3/2009 |
| JP | 2009048902 A | * | 3/2009 |
| JP | 2011216256 | | 10/2011 |
| WO | 2013093399 | | 6/2013 |

OTHER PUBLICATIONS

"Written Opinion of the International Searching Authority (Form PCT/ISA/237) of PCT/JP2019/043734," dated Jan. 7, 2020, with English translation thereof, pp. 1-8.
"Search Report of Europe Counterpart Application", dated Jun. 29, 2022, p. 1-p. 8.
"Office Action of Japan Counterpart Application" with English translation thereof, dated Sep. 21, 2021, p. 1-p. 14.

* cited by examiner

SENSOR

CROSS-REFERENCE TO RELATED APPLICATION

This application is a 371 application of the International PCT application serial no. PCT/JP2019/043734, filed on Nov. 7, 2019, which claims the priority benefits of Japan Patent Application No. 2018-212354, filed on Nov. 12, 2018. The entirety of each of the above-mentioned patent applications is hereby incorporated by reference herein and made a part of this specification.

BACKGROUND

Technical Field

The invention relates to a sensor.

Description of Related Art

Conventionally, a proximity sensor has been known as an example of sensors that detect whether an object is present in a detection area. The proximity sensor includes a housing, and electronic components such as a coil and a circuit provided inside the housing to generate a magnetic field. In addition, the proximity sensor measures the change in impedance of the coil due to an induced current generated in the object that approaches the coil via the circuit, and detects whether a detection target is present. Such coil and circuit are easily affected by electromagnetic waves from the outside of the housing. When the external electromagnetic waves enter the housing, noise overlaps an electric signal flowing through the coil and circuit, and abnormalities such as a malfunction of the proximity sensor may occur. As a result, the proximity sensor may not be able to correctly detect whether an object is present. Considering such a problem, the proximity sensor is required to suppress penetration of noise from the outside of the housing so as to improve the detection performance of the sensor.

For example, Patent Document 1 discloses a proximity sensor that includes a case body, a coil assembly including a core and a detection coil, a printed board provided with a processing circuit electrically connected to the detection coil, and a plate-shaped shield part arranged on a front surface of the core to cover a front surface of the coil assembly so as to prevent penetration of noise from the outside. As described above, the proximity sensor described in Patent Document 1 employs the shield part that covers the front surface of the coil assembly to electromagnetically shield noise from the outside of the housing with the shield and thereby suppress penetration of the noise into the housing.

RELATED ART

Patent Document

[Patent Document 1] Japanese Laid-Open No. 2009-48902

SUMMARY

Problems to be Solved

For a proximity sensor as in Patent Document 1, in order to increase the detection sensitivity, the coil assembly may be arranged at a position as close to the front end (detection side) of the case body as possible. Thus, when a shield part as in Patent Document 1 is employed, the coil assembly is arranged to be in direct contact with the shield part on the front end side of the case end with respect to the coil assembly. However, an eddy current generated in this shield part due to noise from the outside of the housing may affect the coil. As a result, noise due to the eddy current overlaps the electric signal flowing through the coil, which may cause the proximity sensor to malfunction and become unable to correctly detect whether an object is present.

Therefore, the invention provides a sensor with improved detection performance.

Means for Solving the Problems

A sensor according to one aspect of the invention includes a housing which houses an electronic component in an internal space; a coil part which has a coil and a core that holds the coil and which is arranged on an end side of the internal space; a substrate which is arranged on an inner side of the internal space with respect to the coil part and is provided with a circuit electrically connected to the coil; a shield at least one portion of which is arranged on the end side of the internal space with respect to the coil part and which suppresses penetration of noise from outside of the housing; and a separator which is positioned between the shield and the coil part and separates surfaces of the shield and the coil part that face each other.

According to this aspect, the surfaces of the shield and the coil part that face each other are separated in an insulating manner. Thereby, noise due to the shield eddy current generated in the shield is less likely to be applied to the coil part, and noise due to the shield eddy current can be prevented from overlapping the electric signal flowing through the coil part. That is, the noise resistance of the sensor is enhanced. As a result, the detection performance of the sensor can be improved.

In the above aspect, the separator may be an air layer.

According to this aspect, the number of components during assembly can be reduced, and the noise resistance of the sensor can be enhanced and the detection performance of the sensor can be improved.

In the above aspect, the separator may be an insulating spacer.

According to this aspect, the noise resistance of the sensor can be enhanced and the detection performance of the sensor can be improved by using a simple configuration.

In the above aspect, the spacer and the shield may be separate bodies.

In the above aspect, the spacer may be provided on a surface of the coil part that faces the end side, and may be integrally formed with the coil part.

According to this aspect, by reducing the number of components during assembly, the noise resistance of the sensor can be enhanced and the stability can be improved.

In the above aspect, the housing may be electrically conductive, and have a housing end which is provided at the end with at least one portion facing the shield, and the sensor may further include a housing-side separator which is positioned between the housing end and the shield and which separates surfaces of the housing end and the shield that face each other.

According to this aspect, the shield eddy current generated in the shield is also reduced, the influence on the coil part is reduced, and a sensor having higher noise resistance can be obtained.

In the above aspect, the housing-side separator may be an air layer or an insulating spacer.

According to this aspect, the noise resistance of the sensor can be enhanced and the detection performance of the sensor can be improved.

In the above aspect, the housing may be electrically conductive, and the sensor may further include an insulating case which is arranged between the housing and the shield and which separates the housing and the shield from contacting each other.

According to this aspect, the shield eddy current generated in the shield is also reduced without lowering the detection sensitivity of the sensor, the influence on the coil part can also be reduced, and a sensor having higher noise resistance can be obtained.

Effects

According to the invention, a sensor with improved detection performance can be provided.

DESCRIPTION OF THE EMBODIMENTS

Figure 1:
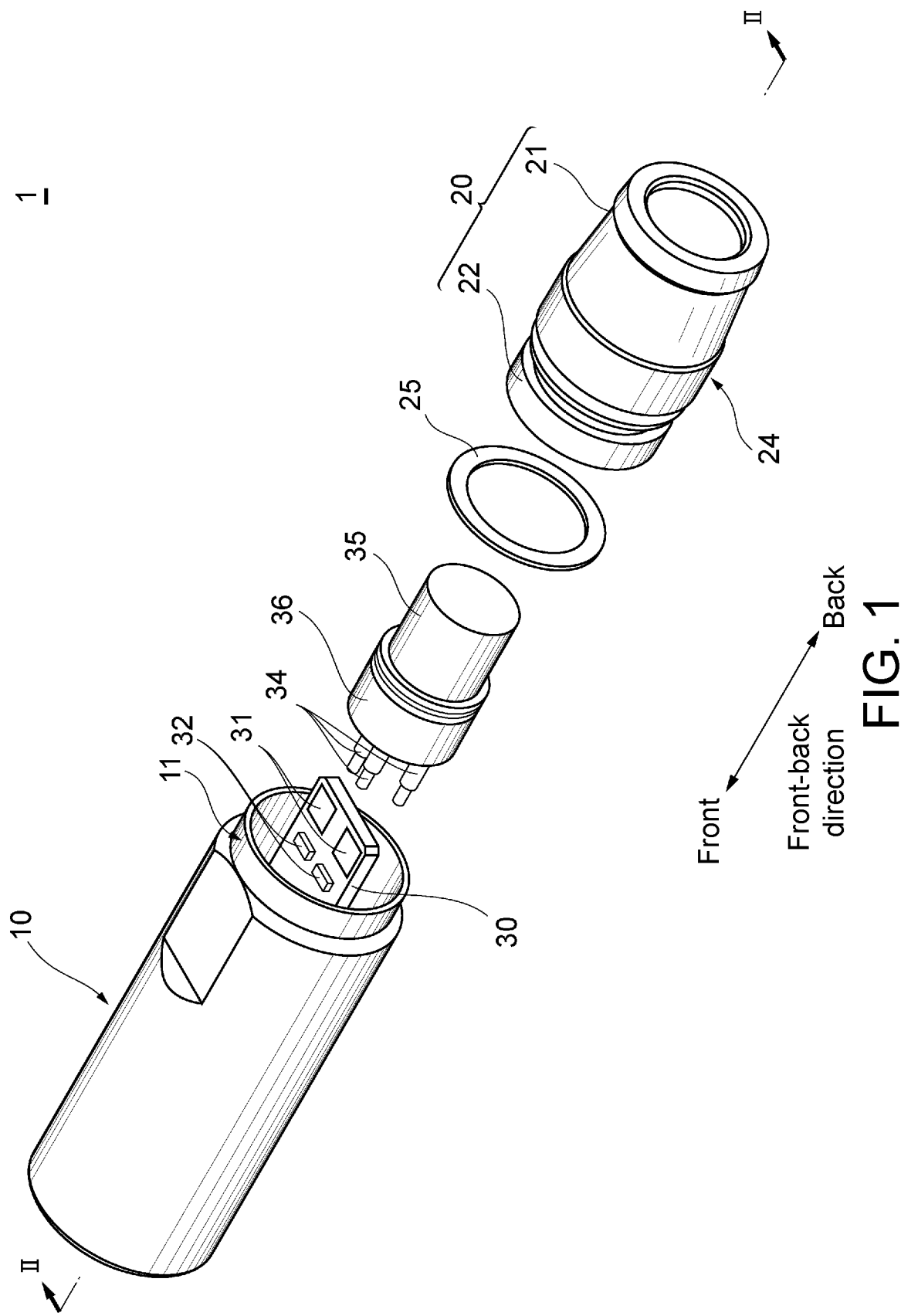
FIG. 1 is an exploded perspective view showing the sensor according to the first embodiment.

Embodiments of the invention will be described with reference to the accompanying drawings. In each drawing, parts with the same reference numerals have the same or similar configurations.

First Embodiment

Figure 2:
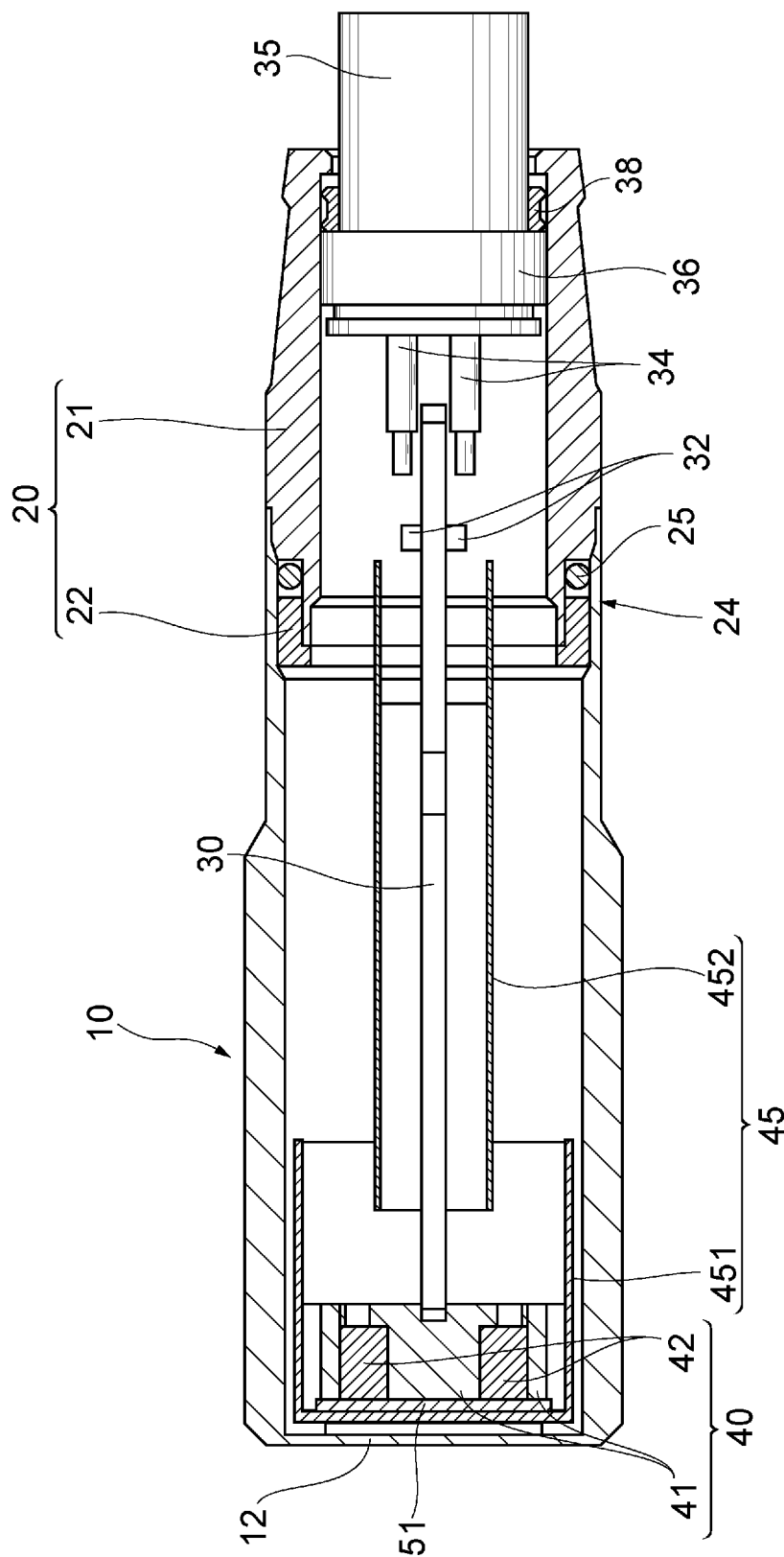
FIG. 2 is a cross-sectional view taken along the line II-II in a state where the sensor shown in FIG. 1 is assembled.

The internal structure of a sensor 1 according to the first embodiment will be described with reference to FIG. 1 and FIG. 2. FIG. 1 is an exploded perspective view of the sensor 1 according to the first embodiment. FIG. 2 is a cross-sectional view taken along the line II-II in a state where the sensor 1 shown in FIG. 1 is assembled.

The internal structure of the sensor 1 will be described with reference to FIG. 1 and FIG. 2. FIG. 1 is an exploded perspective view of the sensor 1 according to the first embodiment. FIG. 2 is a cross-sectional view taken along the line II-II in a state where the sensor 1 shown in FIG. 1 is assembled.

The sensor 1 according to the first embodiment is a proximity sensor capable of detecting that a detection target is approaching in a non-contact manner, and includes a housing 10, a clamp 20, an O-ring 25, a substrate 30, a cable wire 34, a cable 35, a ring component 36, a detection unit 40, a shield part 45, and a spacer 51. The housing 10 is formed in a bottomed tubular shape, and has an opening 11 at one end and has a housing end 12 provided to close an opening on the other end side at the other end. Electronic components such as the substrate 30 are inserted through the opening 11 and housed in an internal space of the housing 10. The housing 10 is made of an electrically conductive material such as metal. Here, the outer shape of the sensor 1 is a cylindrical shape, but the outer circumference of the housing 10 and the clamp 20 may be a prismatic shape that is polygonal.

The clamp 20 has an end connected to the opening 11 of the housing 10 to protect the electronic components such as the substrate 30 housed in the housing 10. As shown by the arrow in FIG. 1, along an axial direction of the sensor 1, a direction from the clamp 20 toward the housing 10 is the front and a direction from the housing 10 toward the clamp 20 is the back, and as shown in FIG. 2, a front portion of the clamp 20 is inserted into the housing 10 through the opening 11. Most of the area of the substrate 30 is housed in the housing 10, but a back area of the substrate 30 is housed in the clamp 20. Further, the cable wire 34, the ring component 36, and a part of the cable 35 are housed in the clamp 20.

The clamp 20 includes tubular first component 21 and second component 22. Specifically, a front side end of the first component 21 is fitted inside the second component 22. The clamp 20 has a recess 24 between the first component 21 and the second component 22, and the O-ring 25 is attached to the recess 24. As shown in FIG. 2, the O-ring 25 is positioned inside the housing 10 in a state where the sensor 1 is assembled, and seals a gap between the inner wall of the housing 10 and the outer wall of the clamp 20.

The clamp 20 (first component 21, second component 22) can be made of resin or metal, but preferably the clamp 20 is made of a transparent material that transmits visible light for visibly recognizing an indicator lamp 32 positioned inside the sensor 1 from the outside.

The substrate 30 is a substrate for mounting a control circuit (not shown) that controls the detection unit 40 and a current supply circuit (not shown) that supplies a current to the detection unit 40, and a part of the substrate 30 is housed in the housing 10. As shown in FIG. 2, the detection unit 40 is attached to an end on the front side of the substrate 30. The detection unit 40 detects whether the detection target is present in a non-contact manner. The detection unit 40 is a coil part including a core 41 in which a coil 42 is housed and the coil 42 wound in an annular shape. Further, a land 31 is provided at an end on the back side of the substrate 30, and is electrically connected to the cable wire 34. Here, a method for the sensor 1 to detect the detection target will be described. First, an exciting current is supplied to the coil 42 from the current supply circuit mounted on the substrate 30. The coil 42 generates a magnetic field based on the supplied exciting current. When the detection target such as metal approaches the coil 42 in this state, an eddy current is generated inside the detection target according to the law of electromagnetic induction. Because the eddy current generates a magnetic field, the magnetic flux penetrating the coil 42, and thus the impedance of the coil 42, changes. The control circuit connected to the detection unit 40 measures the change in the impedance of the coil 42 and detects whether the detection target is present.

The indicator lamp 32 that displays the operating state of the sensor 1 is mounted on the substrate 30. The indicator lamp 32 may be, for example, an LED or the like. In the present embodiment, the indicator lamp 32 lights up when the power of the sensor 1 is turned on or when the sensor 1 detects the detection target.

The cable 35 is provided by applying a protective coating to a plurality of cable wires 34. The cable wire 34 is electrically connected to the land 31 of the substrate 30. The cable wire 34 may supply electric power from an external power source to the circuits mounted on the substrate 30. Further, the cable wire 34 may transmit an output signal from the control circuit mounted on the substrate 30 to an external device such as an amplifier.

The ring component 36 is provided on the outer circumference of the cable 35 to prevent the cable 35 from being damaged. In detail, the ring component 36 is formed by injection molding or the like at a position covering an end of the protective coating on the cable 35. Further, the ring component 36 is in close contact with sealing resin filled inside the housing 10, and fixes the cable 35 to the clamp 20.

A sealing ring 38 is provided between the cable 35 and the first component 21 so as to surround the cable 35 in an area behind the ring component 36. The sealing ring 38 seals a gap between the inner wall of the clamp 20 and the outer circumference of the cable 35. The sealing ring 38 prevents liquid or dust from entering from the outside of the sensor 1. Further, the sealing ring 38 prevents the sealing resin filled inside the sensor 1 from leaking to the outside.

The shield part 45 removes noise (hereinafter, referred to as "external noise") that penetrates from the outside to the inside of the housing 10. The shield part 45 is provided to surround the detection unit 40 and a part of the substrate 30, and suppresses the external noise from reaching the detection unit 40 and the substrate 30. In addition, the shield part 45 may be made of, for example, a metal film or may be made of a laminated structure of a copper foil layer and a polyimide resin layer. When the shield part 45 is a laminated structure, the shield part 45 is laminated in the order of a polyimide resin layer, a copper foil layer, and a polyimide resin layer. In this way, the shield part 45 is configured to be insulated from the electronic components such as the housing 10 on the front side and the detection unit 40 on the back side via the polyimide resin layers formed on both sides (front side and back side) of the copper foil layer.

Further, in the example shown in FIG. 2, the shield part 45 has a first shield 451 that mainly suppresses the external noise from reaching the detection unit 40, and a second shield 452 that mainly suppresses the external noise from reaching the substrate 30. The first shield 451 is an example of the shield. The first shield 451 and the second shield 452 are separate bodies, and both have, for example, a structure formed by laminating copper foil and polyimide resin. Further, the first shield 451 is provided around both end surfaces and a side surface of the detection unit 40 on the back side of the housing end 12. The second shield 452 is provided around the substrate 30 in the longitudinal direction with a gap between the second shield 452 and the substrate 30. The details of the arrangement relationship between the first shield 451 and the detection unit 40 will be described together with the spacer 51 described later.

The spacer 51 is an example of the separator, and separates the first shield 451 and the detection unit 40. The spacer 51 is, for example, a disk-shaped member, and has an outer diameter smaller than the inner diameter of the housing 10. Further, the spacer 51 is made of an insulating material. The spacer 51 is arranged between the first shield 451 and the detection unit 40.

Then, the arrangement relationship between the first shield 451, the spacer 51, and the detection unit 40 will be described in detail. The first shield 451, the spacer 51, and the detection unit 40 are arranged toward the housing end 12 in the order of the first shield 451, the spacer 51, and the detection unit 40 from the front to the back in the internal space of the housing 10. Further, in the first embodiment, as shown in FIG. 2, the spacer 51 is arranged to be sandwiched between the first shield 451 and the detection unit 40. That is, the spacer 51 is positioned between the first shield 451 and the detection unit 40, and separates the surfaces of the first shield 451 and the core 41 of the detection unit 40 that face each other.

By employing the insulating spacer 51 according to the first embodiment in this way, the surfaces of the first shield 451 and the detection unit 40 that face each other are separated in an insulating manner. Therefore, the influence of the eddy current generated on the surface of the first shield 451 facing the detection unit 40 due to the external noise on the coil 42 of the detection unit 40 can be reduced.

Specifically, when the external noise is applied to the housing end 12, an eddy current (hereinafter, referred to as "housing eddy current") is generated at the housing end 12. Then, noise due to the housing eddy current is applied to the first shield 451 to generate an eddy current (hereinafter, referred to as "shield eddy current") in the first shield 451. Here, assuming that the first shield 451 and the detection unit 40 are in direct contact with each other, noise due to the shield eddy current generated in the first shield 451 is applied to the detection unit 40 and overlaps the electric signal flowing through the coil 42 of the detection unit 40. Because of this, the sensor 1 may erroneously detect. In contrast thereto, when the spacer 51 is employed, the surfaces of the first shield 451 and the detection unit 40 that face each other are separated in an insulating manner, and noise due to the shield eddy current generated in the first shield 451 is less likely to be applied to the detection unit 40. That is, by suppressing the direct contact between the first shield 451 and the detection unit 40, noise due to the shield eddy current can be prevented from overlapping the electric signal flowing through the coil 42 of the detection unit 40. In this way, erroneous detection of the sensor 1 is suppressed, and the sensor 1 can correctly detect whether an object is present.

In other words, by employing the spacer 51 according to the first embodiment, the noise resistance of the sensor 1 is enhanced. As a result, the detection performance of the sensor 1 can be improved.

The first embodiment illustrates that the spacer 51 is provided separately from the first shield 451 or the detection unit 40. However, the spacer 51 may be joined to the surface of the first shield 451 facing the detection unit 40 (back) or the surface of the core 41 of the detection unit 40 facing the side of the housing end 12 (front), and be formed integrally with the first shield 451 or the detection unit 40. Further, when joined to the first shield 451, the spacer 51 is joined to the polyimide resin layer on the side (back side) of the first shield 451 facing the detection unit 40.

Second Embodiment

Figure 3:
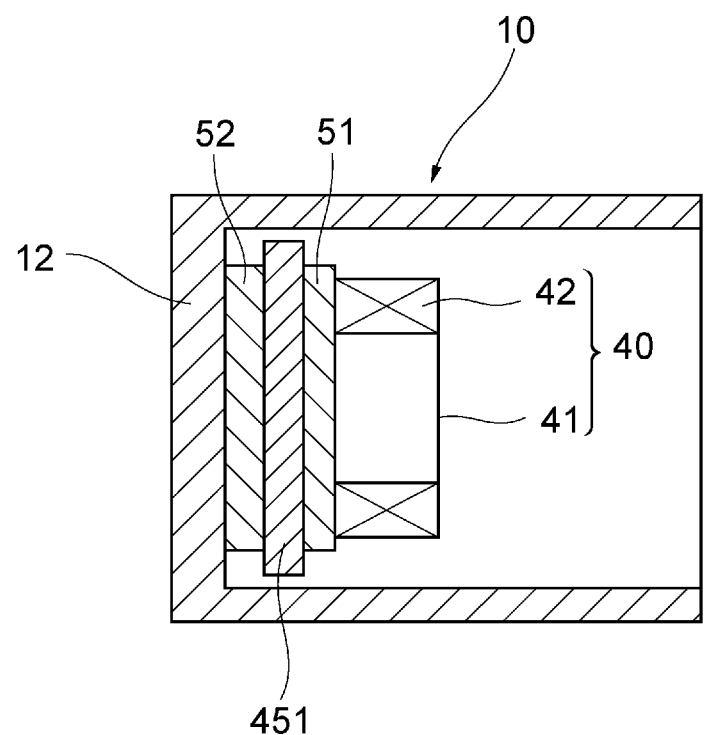
FIG. 3 is a schematic diagram for illustrating a partial configuration of the sensor according to the second embodiment.

Then, the configuration of the sensor 1 according to the second embodiment will be described with reference to FIG. 3. Here, FIG. 3 is a schematic diagram for illustrating a partial configuration of the sensor 1 further having a housing-side spacer 52 according to the second embodiment.

The second embodiment is an embodiment that focuses on reducing the influence of noise due to the shield eddy current generated in the first shield 451 on the detection unit 40 and focuses on reducing the influence of noise due to the housing eddy current generated at the housing end 12 on the first shield 451, and employs the housing-side spacer 52 between the housing end 12 and the shield part 451 in addition to the spacer 51. Further, in the second embodiment, the description of the matters common to the first embodiment will be omitted, and only the differences, that is, the configuration and effects of the housing-side spacer 52 will be described. In particular, the same effects caused by the same configuration will not be mentioned.

The housing-side spacer 52 according to the second embodiment is an example of the housing-side separator, and separates the housing end 12 and the first shield 451. The housing-side spacer 52 is, for example, a disk-shaped member, and has an outer diameter smaller than the inner diameter of the housing 10. Further, the housing-side spacer 52 is made of an insulating material, and may have the same configuration as the spacer 51. As shown in FIG. 3, the housing-side spacer 52 is arranged on the back side of the housing end 12 to be sandwiched between the housing end 12 and the first shield 451. That is, the housing-side spacer 52 is positioned between the housing end 12 and the first shield 451, and separates the surfaces of the housing end 12 and the first shield 451 that face each other.

By employing the housing-side spacer 52 according to the second embodiment in this way, the surfaces of the housing end 12 and the first shield 451 that face each other are separated in an insulating manner. Therefore, the influence of the housing eddy current generated on the surface of the housing end 12 facing the first shield 451 due to the external noise on the first shield 451 can be reduced.

Specifically, when the external noise is applied to the housing end 12, the housing eddy current is generated at the housing end 12. Then, noise due to the housing eddy current is applied to the first shield 451 to generate the shield eddy current in the first shield 451. Noise due to the shield eddy current affects the detection unit 40. In contrast thereto, when the housing-side spacer 52 is employed, the surfaces of the housing end 12 and the first shield 451 that face each other are separated in an insulating manner, and noise due to the housing eddy current generated at the housing end 12 is less likely to be applied to the first shield 451. That is, by suppressing the direct contact between the housing end 12 and the first shield 451, the application of noise due to the housing eddy current to the first shield 451 can be reduced. As described above, as the influence of noise due to the housing eddy current received by the first shield 451 is reduced, the shield eddy current generated in the first shield 451 decreases. In this way, the influence of the shield eddy current generated in the first shield 451 on the coil 42 of the detection unit 40 can also be reduced. As a result, the sensor 1 has higher noise resistance as compared with the case where only the spacer 51 is employed.

In other words, by employing the housing-side spacer 52 according to the second embodiment, the noise resistance of the sensor 1 is further enhanced as compared with the case where only the spacer 51 is employed. As a result, the detection performance of the sensor 1 can be improved as compared with the case where only the spacer 51 is employed.

The second embodiment illustrates that the housing-side spacer 52 is provided separately from the housing end 12 or the first shield 451. However, the housing-side spacer 52 may be joined to the surface of the housing end 12 facing the first shield 451 (back) or the surface of the first shield 451 facing the side of the housing end 12 (front), and be formed integrally with the housing end 12 or the first shield 451. Further, when jointed to the first shield 451, the housing-side spacer 52 is joined to the polyimide resin layer on the side (front side) of the first shield 451 facing the housing end 12.

Third Embodiment

Figure 4:
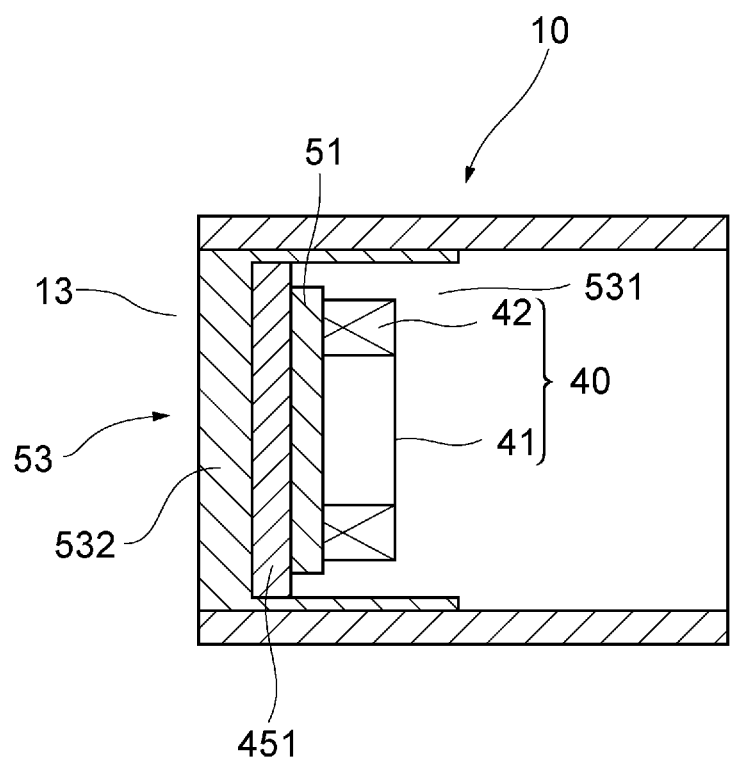
FIG. 4 is a schematic diagram for illustrating a partial configuration of the sensor according to the third embodiment.

Then, the configuration of the sensor 1 according to the third embodiment will be described with reference to FIG. 4. Here, FIG. 4 is a schematic diagram for illustrating a partial configuration of the sensor 1 having a case 53 according to the third embodiment.

Similar to the second embodiment, the third embodiment focuses on reducing the influence of noise due to the shield eddy current generated in the first shield 451 on the detection unit 40 and focuses on reducing (suppressing) the influence of noise due to the housing eddy current generated at the housing end on the first shield 451. The difference between the third embodiment and the second embodiment is that, in the third embodiment, the case 53 is employed in place of the housing end 12 and the housing-side spacer 52 according to the second embodiment. Further, in the third embodiment, the description of the matters common to the first embodiment and the second embodiment will be omitted, and only the differences, that is, the configuration and effects of the housing 10 and the case 53 will be described. In particular, the same effects caused by the same configuration will not be mentioned.

The housing 10 according to the third embodiment does not have the housing end 12 on the end side where the detection unit 40 according to the second embodiment is provided.

That is, the housing 10 has a tubular shape that has an opening 13 on the end side where the detection unit 40 is provided.

The case 53 is formed in a bottomed cylindrical shape, and has an opening 531 at one end and has a case end 532 provided to close an opening on the other end side at the other end. The case 53 is made of an insulating material such as resin. Further, the case 53 is inserted through the opening 13 of the housing 10 with the case end 532 facing the front side and the opening 531 facing backward, and is fixed to the housing 10 to close the opening 13. Thus, the case end 532 constitutes an insulating end portion of the housing 10.

In addition, when the case 53 is employed, the first shield 451 and the detection unit 40 are arranged in the order of the first shield 451 and the detection unit 40 from the front to the back in the internal space of the case 53. That is, as shown in FIG. 4, the first shield 451 is arranged to be sandwiched between the case end 532 and the spacer 51.

By employing the case 53 according to the third embodiment in this way, the generation of the housing eddy current at the end portion (case end 532) of the housing 10 due to the external noise can be suppressed to suppress the influence of the housing eddy current on the first shield 451.

Specifically, because the case end 532 has an insulating configuration, it becomes difficult for the external noise to generate the housing eddy current at the case end 532. That is, the generation of the housing eddy current at the case end 532 is suppressed. Then, the generation of noise due to the housing eddy current is suppressed, and noise due to the housing eddy current is not applied to the first shield 451 and the generation of the shield eddy current in the first shield 451 is suppressed. That is, the influence of the shield eddy current generated in the first shield 451 on the coil 42 of the detection unit 40 can be suppressed. As a result, erroneous detection of the sensor 1 is suppressed, and the sensor 1 can correctly detect whether an object is present.

In other words, by employing the case 53 according to the third embodiment, the noise resistance of the sensor 1 is further enhanced as compared with the case where only the spacer 51 is employed. As a result, the detection performance of the sensor 1 can be improved as compared with the case where only the spacer 51 is employed. Further, because the case end 532 of the case 53 replaces the end portion of the housing 10 and the housing-side spacer 52 according to the second embodiment, the detection unit 40 can be arranged on the side closer to the end on the front side of the housing 10 than in the second embodiment. Therefore, in the third embodiment, the detection performance of the sensor 1 is improved without lowering the detection sensitivity of the sensor 1.

The third embodiment illustrates that the housing 10 is configured to be open at both ends. However, the housing 10 according to the third embodiment may have a bottomed configuration similar to the housing 10 according to the first embodiment and the second embodiment. That is, the housing 10 according to the third embodiment may have a configuration having the housing end 12. In that case, the case end 532 is arranged on the back side of the housing end 12.

Modified Example

The invention is not limited to the above embodiments and various modifications can be made. The above embodiment illustrates the spacer 51 as the separator for separating the surfaces of the first shield 451 and the detection unit 40 that face each other. However, the separator is not limited to an insulating member such as a spacer, and may be, for example, an air layer, a layer made of other gases or other configurations capable of separating the surfaces of the first shield 451 and the detection unit 40 that face each other in an insulating manner. Further, the same modification can be employed for the housing-side spacer 52.

In addition, the second embodiment illustrates a configuration employing the spacer 51 and the housing-side spacer 52, but it is possible to employ only the housing-side spacer 52. Similarly, the third embodiment illustrates a configuration employing the case 53 and the spacer 51, but it is possible to employ only the case 53.

Furthermore, the above embodiment illustrates a configuration employing one spacer 51 between the first shield 451 and the detection unit 40, but the number of the spacers 51 may be two or more. Further, when two or more spacers 51 are employed, these spacers 51 may have a combination configuration of air layers and spacers. Further, the same modification can also be employed for the housing-side spacer 52.

In addition, the above embodiment illustrates that the housing 10 is electrically conductive, but the housing 10 may be made of an insulating material such as resin.

The embodiments described above are for facilitating the understanding of the invention, and are not for limiting and interpreting the invention. Each element included in the embodiments and the arrangement, material, condition, shape, size, etc. thereof are not limited to those exemplified, and can be changed as appropriate. In addition, the configurations shown in different embodiments can be partially replaced or combined.

[Descriptions of Reference Numerals]

What is claimed is:

1. A sensor, comprising:
   a housing which houses an electronic component in an internal space, wherein the housing is electrically conductive, and has a planar housing end which defines an end side of the internal space;
   a coil part which has a coil and a core that holds the coil and which is arranged on the end side of the internal space;
   a substrate which is arranged on an inner side of the internal space with respect to the coil part and is provided with a circuit electrically connected to the coil;
   a shield at least one portion of which is planar and arranged on the end side of the internal space between the coil part and the planar housing end, the shield suppressing penetration of noise from outside of the housing;
   a separator which is positioned between the at least one portion of the shield and the coil part and separates all surfaces of the at least one portion of the shield and the coil part that face each other; and
   a housing-side separator which is positioned between the planar housing end and the at least one portion of the shield and which separates surfaces of the planar housing end and the at least one portion of the shield that face each other.

2. The sensor according to claim 1, wherein the separator is an air layer.

3. The sensor according to claim 1, wherein the separator is an insulating spacer.

4. The sensor according to claim 3, wherein the spacer and the shield are separate bodies.

5. The sensor according to claim 4, wherein the spacer is provided on a surface of the coil part that faces the end side, and is joined to the surface of the coil part.

6. The sensor according to claim 1, wherein the housing-side separator is an air layer or an insulating spacer.

* * * * *